(12) United States Patent
Yang (10) Patent No.: US 8,415,733 B2
(45) Date of Patent: Apr. 9, 2013

(54) SEMICONDUCTOR MEMORY DEVICE AND METHOD FOR FABRICATING THE SAME

(75) Inventor: Hee Jung Yang, Suwon (KR)

(73) Assignee: Hynix Semiconductor Inc., Icheon (KR)

( * ) Notice: Subject to any disclaimer, the term of this patent is extended or adjusted under 35 U.S.C. 154(b) by 447 days.

(21) Appl. No.: 12/650,345

(22) Filed: Dec. 30, 2009

(65) Prior Publication Data

US 2010/0327337 A1    Dec. 30, 2010

(30) Foreign Application Priority Data

Jun. 30, 2009   (KR) ........................ 10-2009-0058727

(51) Int. Cl.
*H01L 27/108* (2006.01)

(52) U.S. Cl.
USPC .................. 257/311; 257/334; 257/E27.016; 438/270; 438/589

(58) Field of Classification Search .................. 257/311, 257/334, E21.598, E27.016; 438/238, 270, 438/288, 589
See application file for complete search history.

(56) References Cited

U.S. PATENT DOCUMENTS

| 7,563,686 | B2 * | 7/2009 | Lee et al. ....................... 438/386 |
| 2005/0230734 | A1 * | 10/2005 | Ha et al. ......................... 257/306 |
| 2007/0032033 | A1 * | 2/2007 | Heineck et al. ................ 438/386 |
| 2008/0096353 | A1 * | 4/2008 | Rouh et al. ..................... 438/270 |
| 2010/0155701 | A1 * | 6/2010 | Radosavljevic et al. ......... 257/24 |

FOREIGN PATENT DOCUMENTS

| KR | 1020070002605 A | 1/2007 |
| KR | 1020070002688 A | 1/2007 |
| KR | 1020070014428 A | 2/2007 |
| KR | 100696764 B1 | 3/2007 |

* cited by examiner

*Primary Examiner* — Matthew Landau
*Assistant Examiner* — Colleen E Snow (57) ABSTRACT

A semiconductor memory device has an asymmetric buried gate structure with a stepped top surface and a method for fabricating the same. The method for fabricating the semiconductor memory device includes: etching a predetermined region of a semiconductor substrate to form an isolation layer defining an active region; forming a recess within the active region; forming a metal layer filling the recess; asymmetrically etching the metal layer to form an asymmetric gate having a stepped top surface at a predetermined portion of the recess; and forming a capping oxide layer filling a remaining portion of the recess where the asymmetric gate is not formed, thereby obtaining an asymmetric buried gate including the asymmetric gate and the capping oxide layer.

14 Claims, 12 Drawing Sheets

SEMICONDUCTOR MEMORY DEVICE AND METHOD FOR FABRICATING THE SAME

CROSS-REFERENCE TO RELATED APPLICATION

Priority to Korean patent application number 10-2009-0058727, filed on Jun. 30, 2009, which is incorporated by reference in its entirety, is claimed.

BACKGROUND OF THE INVENTION

The present invention relates to a method for fabricating a highly-integrated semiconductor memory device, and more specifically, to a semiconductor memory device with a buried gate structure with improved operation characteristics, and a method for fabricating the same.

A common semiconductor memory device includes a plurality of unit cells each of which has a capacitor and a transistor. The capacitor temporarily stores data, and the transistor transfers data between a bit line and a capacitor in response to a control signal (which is applied to a word line) by using a semiconductor property that electrical conductivity varies according to environments. The transistor has three regions: a gate, a source, and a drain. Electric charges move between the source and the drain in response to a control signal which is applied to the gate. The electric charges move through the channel formed between the source and the drain.

In forming a general transistor, a gate is formed on a semiconductor substrate, and impurities are doped into the substrate on both sides of the gate to form a source and a drain. To meet requirements for enhanced data storage capacity and integration in a semiconductor memory device, unit cell size needs to be smaller. This decreases the design rule for the capacitor and the transistor. As a result, a channel length becomes shorter, causing a short channel effect and a drain induced barrier lowering (DIBL) effect which may degrade the operational reliability of a semiconductor memory device. Those phenomena caused by the reduction of the channel length may be prevented by maintaining a threshold voltage so that a cell transistor operates normally. To this end, the doping concentration of impurities in the channel region has been increased as a channel length of a transistor gets shorter.

In sub-100 nm design rule, however, the increase of the doping concentration in the channel region causes an electric field increase in a storage node (SN) junction, which may degrade refresh characteristics of the semiconductor memory device. In order to prevent the degradation of refresh characteristics, there has been proposed a cell transistor with a three-dimensional channel structure in which a channel is elongated in a vertical direction so that a channel length of a cell transistor is maintained even though the design rule is reduced. Therefore, even when the channel width in a horizontal direction is short, the doping concentration may be reduced as much as the channel length secured in a vertical direction, thereby preventing the degradation of refresh characteristics.

Meanwhile, as the integration density of a semiconductor memory device becomes higher, the distance between a word line and a bit line connected to a cell transistor becomes smaller. For this reason, a parasitic capacitance increases, and an operational margin of a sense amplifier for amplifying data transferred through a bit line gets worse. Hence, the operational reliability of a semiconductor memory device may be fatally affected. To reduce a parasitic capacitance between a bit line and a word line, there has been proposed a buried gate structure in which a word line, i.e., a gate of a cell transistor, is formed recessed in a semiconductor substrate. In forming the buried gate structure, a recess formed in a semiconductor substrate is filled with a conductive material, and an insulating layer is formed to cover the conductive material, so that a gate is buried within the semiconductor substrate. In this way, a gate may be further electrically isolated from a bit line formed on a semiconductor substrate where a source and a drain are formed.

FIGS. 1a to 1e are cross-sectional views illustrating a method for fabricating a semiconductor device with a general buried gate structure.

Figure 1A:
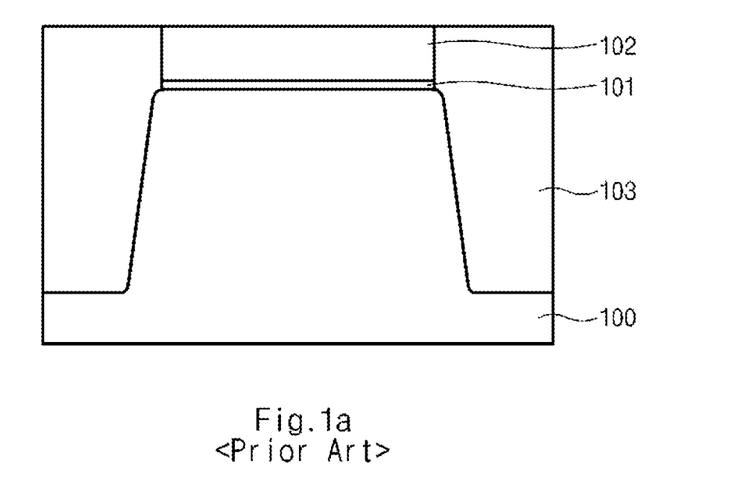
FIGS. 1a to 1e are cross-sectional views illustrating a method for fabricating a semiconductor device with a general buried gate structure.

Referring to FIG. 1a, a pad oxide layer 101 and a pad nitride layer 102 as insulating layers are sequentially deposited on a semiconductor substrate 100. Using a shallow trench isolation (STI) process, an isolation layer 103 is formed to define an active region in the semiconductor substrate 100.

Figure 1B:
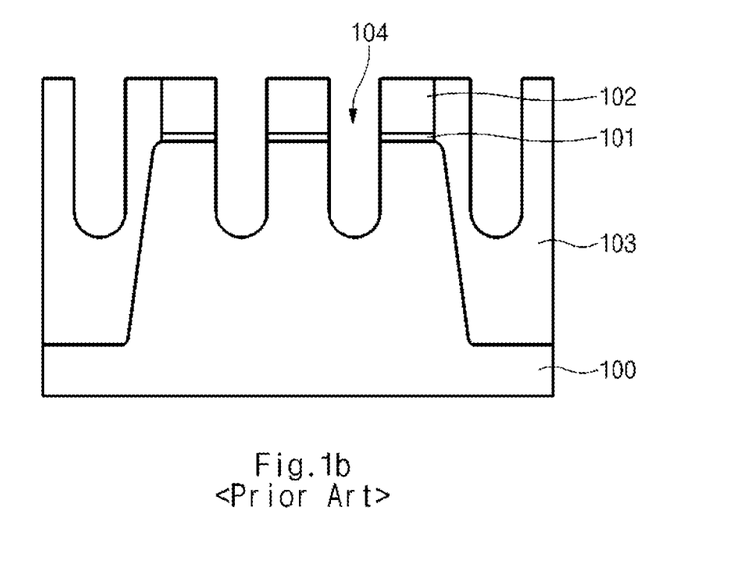

Referring to FIG. 1b, an etch process using a recess gate mask is performed to form recesses 104 inside the active region and the isolation layer 103. Two recesses 104 are formed in the active region, and one recess 104 is formed inside the isolation layer 103.

Figure 1C:
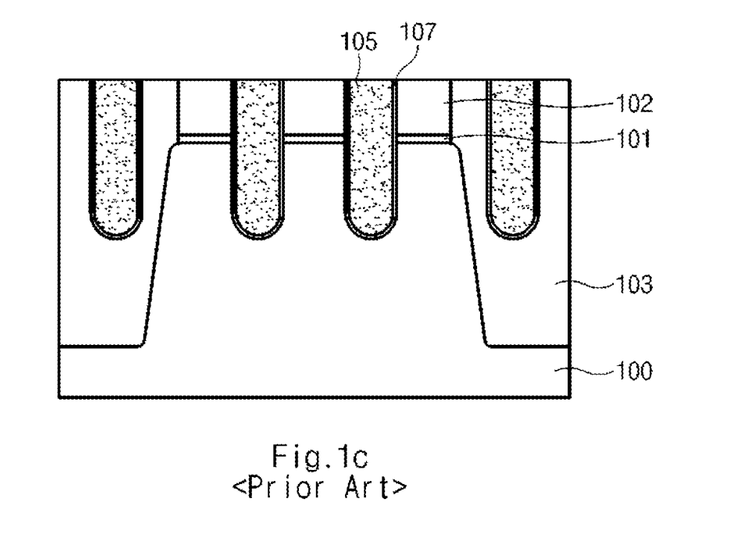

Referring to FIG. 1c, a gate oxidation process is performed over a resulting structure where the recesses 104 are formed, thereby obtaining a gate oxide layer 107 on the surface of each recess 104. A conductive layer 105 is deposited with a predetermined thickness to fill the recess 104. In this case, since the recess 104 is filled with a metal material and not polysilicon, a threshold voltage margin of the gate may be improved because of the difference in electric charge movement between metal and silicon. Then, a chemical mechanical polishing (CMP) process is performed to planarize the conductive layer 105 until the upper portion of the pad nitride layer 102 is exposed.

Figure 1D:
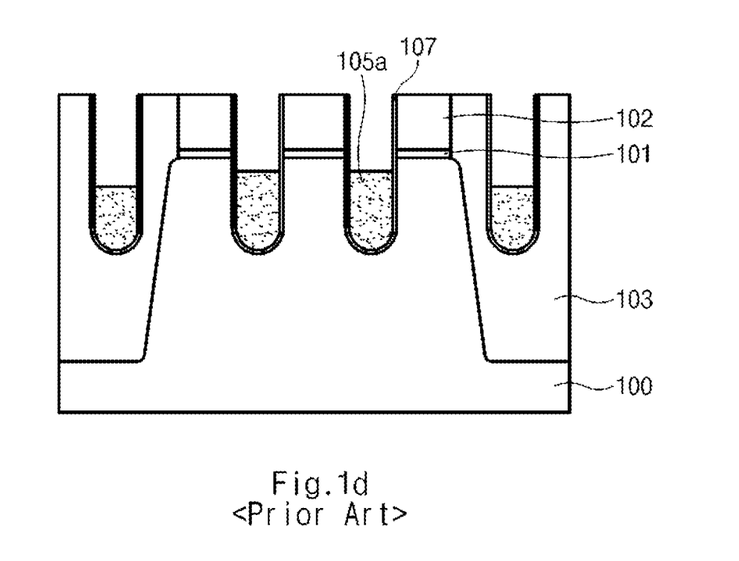

Referring to FIG. 1d, an etch-back process using a difference of etch selectivity between the insulating layers 101 and 102 and the conductive layer 105 is performed to remove a predetermined upper portion of the conductive layer 105 buried within the recess 104, thereby forming a gate 105a.

Figure 1E:
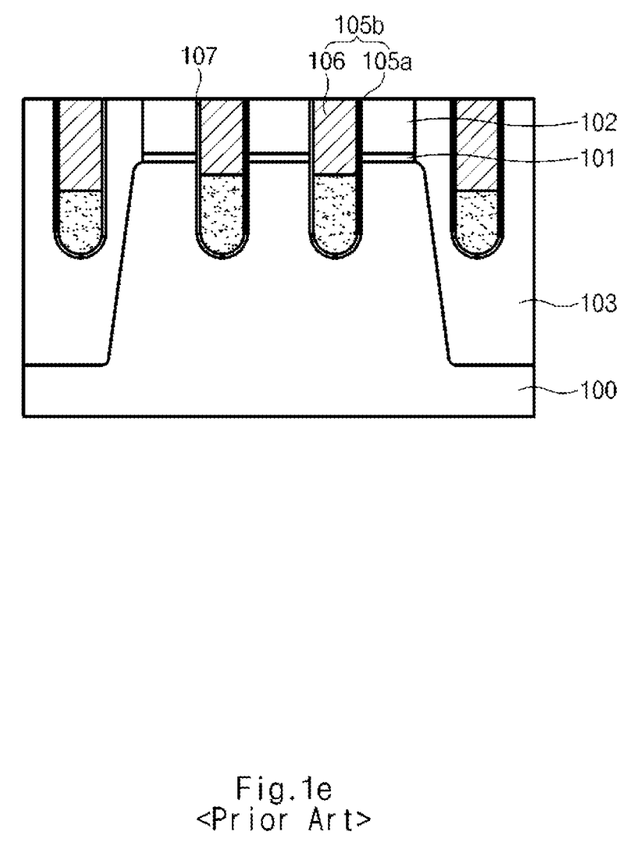

Referring to FIG. 1e, a capping oxide layer 106 is deposited on the recess over the gate 105a and the semiconductor substrate 100, and a planarization process is performed on a resulting structure. In this way, a buried gate structure 105b including the gate 105a and the capping oxide layer 106 is completed.

In recent years, a buried gate structure of the semiconductor memory device has been formed using a metal gate, instead of an N+ poly gate. Since the metal gate has a higher work function than the N+ poly gate, a higher electric field is applied to the gate oxide layer. This causes an increase of gate-induced-drain-leakage (GIDL) and thus degrades the refresh characteristic of the semiconductor memory device.

Figure 2:
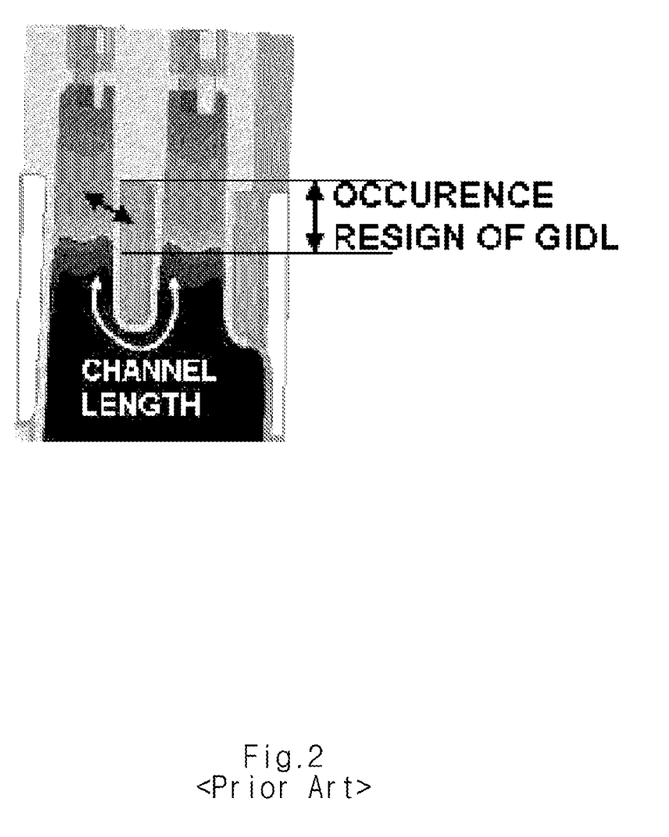
FIG. 2 is a scanning electron microscope (SEM) image explaining a GIDL occurrence principle and a GIDL occurrence region in a general buried gate structure with a metal gate.

FIG. 2 is a scanning electron microscope (SEM) image explaining a GIDL occurrence principle and a GIDL occurrence region in a general buried gate structure with a metal gate.

As illustrated in FIG. 2, as an electric field applied to a gate oxide layer increases in a region where the gate is overlapped with a storage node contact region formed on a lateral side of a buried gate, the occurrence of GIDL increases in the corresponding region, resulting in degradation in the refresh characteristic of the semiconductor memory device. Meanwhile, if the metal layer is etched excessively in order to reduce the region where the gate is overlapped with the storage node contact region, a channel length is reduced and thus the concentration of a channel dose must be increased. The concentration of the channel dose has been increased in order to compensate the channel length that is reduced as the semiconductor memory device is highly integrated. Under those circumstances, further increase of the channel dose by excessive etching of the metal layer may cause an increase of GIDL occurrence and degrade the refresh characteristic of the semiconductor memory device.

BRIEF SUMMARY OF THE INVENTION

Various embodiments of the present invention are directed to providing a semiconductor memory device with a buried gate structure and a method for fabricating the same. In the semiconductor memory device with the buried gate structure, a tapered etch process is performed so that a channel length corresponding to a storage node contact region and a bit line contact region is asymmetric. Accordingly, the occurrence of GIDL is reduced and the channel length is increased.

Various embodiments of the present invention are directed to providing a semiconductor memory device with a buried gate structure and a method for fabricating the same. By forming a buried gate structure with a stepped top surface using an etch mask, a channel length corresponding to a storage node contact region and a bit line contact region is asymmetric. Accordingly, the occurrence of GIDL is reduced and the channel length is increased.

According to an embodiment of the present invention, a method for fabricating a semiconductor memory device includes: etching a predetermined region of a semiconductor substrate to form an isolation layer defining an active region; forming a recess within the active region; forming a metal layer filling the recess; asymmetrically etching the metal layer to form an asymmetric gate having a stepped top surface at a predetermined portion of the recess; and forming a capping oxide layer filling a remaining portion of the recess where the asymmetric gate is not formed, thereby obtaining an asymmetric buried gate including the asymmetric gate and the capping oxide layer.

The forming of the metal layer filling the recess may include: oxidizing the recess to form a gate oxide layer along an inner wall of the recess; depositing a first metal layer along the inner wall of the recess; depositing a second metal layer to fill the recess; and planarizing the first metal layer and the second metal layer.

The first metal layer may be formed of a material having a good interfacial property with respect to the gate oxide layer, and the second metal layer may be formed of a material having a good conductivity.

In forming the asymmetric gate, the metal layer may be asymmetrically etched so that height difference at the stepped top surface of the asymmetric gate is in a range of approximately 0 Å to approximately 500 Å.

A region having a small height in the asymmetric gate may correspond to a storage node contact region, and a region having a large height in the asymmetric gate may correspond to a bit line contact region.

The forming of the asymmetric gate may include asymmetrically etching the metal layer filling the recess by a tapered etch process to form the asymmetric gate the top surface of which has a predetermined slope.

The tapered etch process may use a photoresist flow to form a photoresist pattern having a tapered profile.

The tapered etch process using the photoresist pattern having the tapered profile may include a baking process using a hot plate.

The forming of the asymmetric gate may include: removing an upper portion of the metal layer filled within the recess to form a gate; and etching an upper portion of the gate in a step shape using a gate open mask to form the asymmetric gate.

The gate open mask may expose a predetermined region of the gate corresponding to a storage node contact region and block a predetermined region of the gate corresponding to a bit line contact region.

The forming of the capping oxide layer may be performed so that an oxidation does not occur when contacting the metal layer.

The method may further include implanting ions into the semiconductor substrate on left and right sides of the asymmetric buried gate to form an N-type storage node contact region and an N-type bit line contact region, respectively.

According to another embodiment of the present invention, a semiconductor memory device includes: an isolation layer defining an active region of a semiconductor substrate; a recess formed within the active region; an asymmetric gate formed at a predetermined portion of the recess and having a stepped top surface; and a capping oxide layer filling a remaining portion of the recess where the asymmetric gate is not formed.

The asymmetric gate may include: a first metal layer formed along an inner wall of the recess; a second metal layer formed to fill the predetermined portion of the recess; and an oxide layer formed between the inner wall of the recess and the first metal layer.

The first metal layer may be formed of a material having a good interfacial property with respect to the gate oxide layer, and the second metal layer may be formed of a material having a good conductivity.

Height difference at the stepped top surface of the asymmetric gate may be in a range of approximately 0 Å to approximately 500 Å.

A region having a small height in the asymmetric gate may correspond to a storage node contact region, and a region having a large height in the asymmetric gate may correspond to a bit line contact region.

The top surface of the asymmetric gate may have a predetermined slope.

The top surface of the gate having the predetermined slope may be formed using a tapered etch process.

The top surface of the asymmetric gate may be stepped.

DESCRIPTION OF EMBODIMENTS

A detailed description of the present invention will now be made with reference to the accompanying drawings. Wherever possible, the same reference numbers will be used throughout the drawings to refer to the same or like elements.

FIGS. 3a to 3e are cross-sectional views illustrating a method for fabricating a semiconductor memory device with a buried gate structure according to an embodiment of the present invention.

Figure 3A:
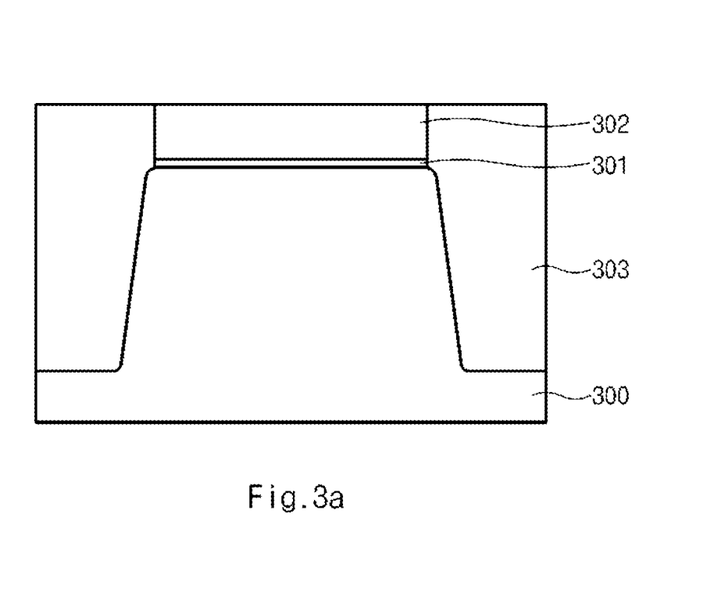
FIGS. 3a to 3e are cross-sectional views illustrating a method for fabricating a semiconductor memory device with a buried gate structure according to an embodiment of the present invention.

Referring to FIG. 3a, a pad oxide layer 301 and a pad nitride layer 302 as insulating layers are sequentially deposited on a semiconductor substrate 300. Using an STI process, an isolation layer 303 is formed to define an active region within the semiconductor substrate 300.

Figure 3B:
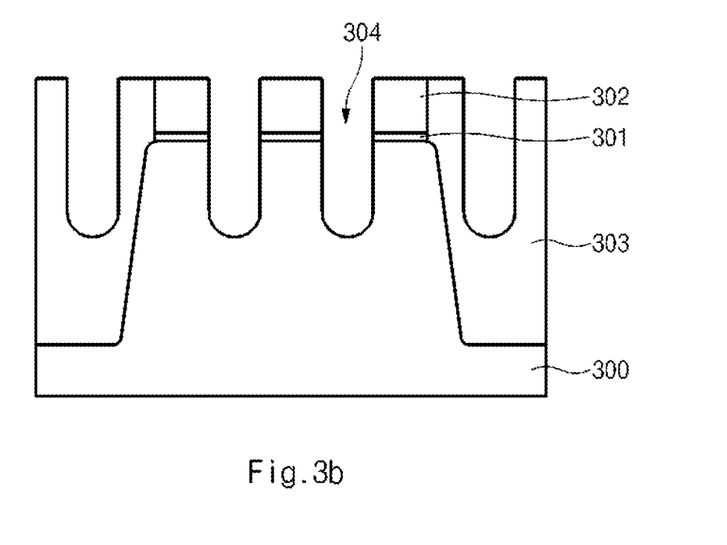

Referring to FIG. 3b, an etch process using a recess gate mask is performed on the active region and the isolation layer 303 to form recesses 304 within the active region and the isolation layer 303. Two recesses 304 are formed in the active region, and one recess 304 is formed within the isolation layer 303.

Figure 3C:
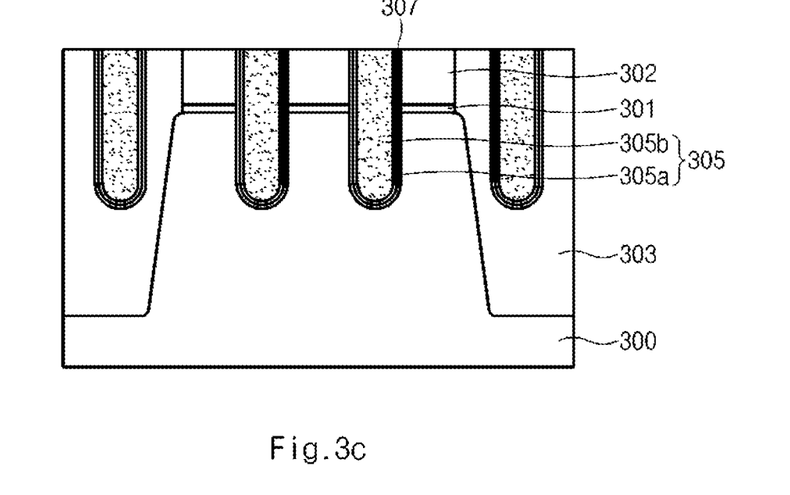

Referring to FIG. 3c, a gate oxidation process is performed on a resulting structure where the recesses 304 are formed, thereby obtaining a gate oxide layer 307 on the surface of each recess 304. A conductive layer 305 including a first metal layer 305a and a second metal layer 305b is deposited to fill the recess 304. At this point, the first metal layer 305a is deposited with a predetermined thickness along an inner wall of the recess 304 where the gate oxide layer 307 is formed. The first metal layer 305a is formed of a material having a good interface characteristic with respect to the gate oxide layer 307, and the second metal layer 305b is formed of a material having a good conductivity. Then, a CMP process is performed to planarize the conductive layer 305 until the upper portion of the pad nitride layer 302 is exposed.

Figure 3D:
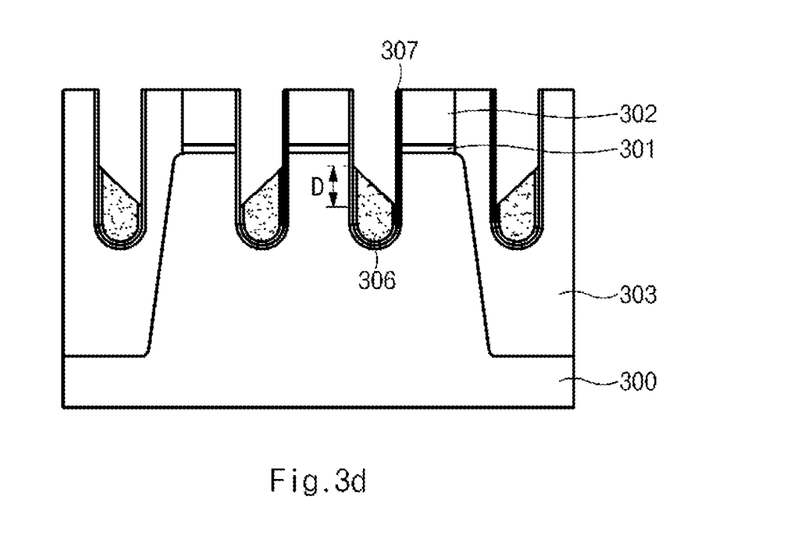

Referring to FIG. 3d, a tapered etch process using an etch selectivity difference between the insulating layers 301 and 302 and the conductive layer 305 is performed to form an asymmetric gate 306 whose top surface is tapered within the recess 304. Herein, the tapered etch process may be performed by forming a photoresist pattern having a tapered profile using photoresist flow, and asymmetrically etching the metal layer using the photoresist pattern. That is, when a baking process is performed using a hot plate for temperature regulation and uniform photoresist flow, flow as well as deformation may occur in the photoresist profile. At this time, since the photoresist at the edge of the photoresist pattern is eroded, the tapered etching is possible in view of the etch profile. Since the flow according to the change in the temperature of the photoresist varies with the thickness of the photoresist, the gate tapered etch process is required to maintain a constant temperature and a uniform thickness of the photoresist during the coating of the photoresist.

In the gate 306, a height difference denoted by "D" between a portion corresponding to a storage node contact region and a portion corresponding to a bit line contact region is in a range from about 0 Å to about 500 Å. Particularly, the height difference is determined based on a channel length and depths of the storage node contact region and the gate. In one embodiment, the height difference is at least 50 Å, so that the height difference is significant enough to provide a channel length of sufficient length. In one embodiment, the height difference is at least 100 Å. In another embodiment, the height difference is greater than 200 Å. In another embodiment, the height difference is greater than 300 Å. In yet another embodiment, the height difference is greater than 400 Å.

Figure 3E:
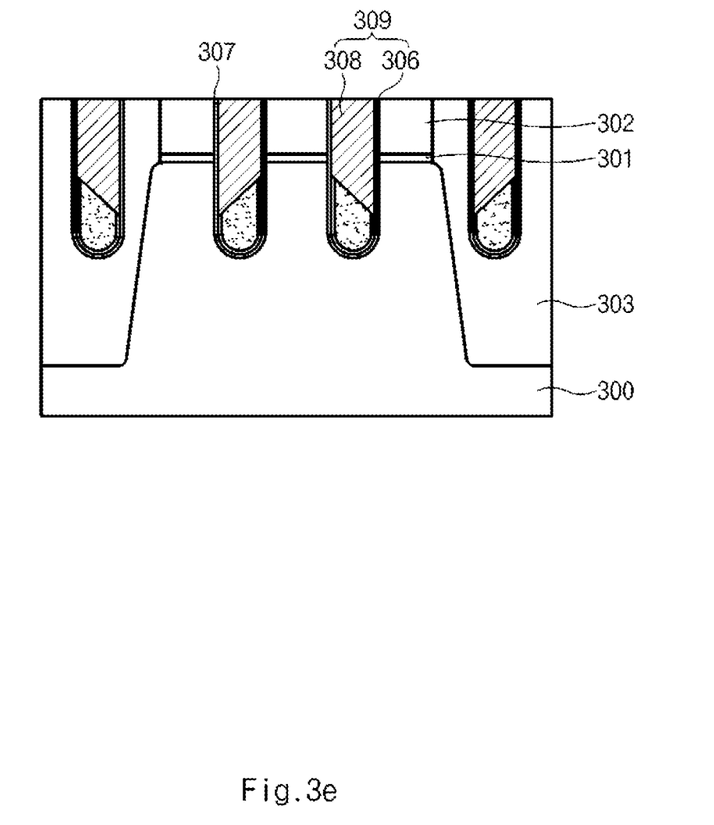

Referring to FIG. 3e, a capping oxide layer 308 is deposited over the recess 304, where the gate 306 is formed, and the semiconductor substrate 100, and a planarization process is performed on a resulting structure. In this way, an asymmetric buried gate structure 309 including the gate 306 and the capping oxide layer 308 is completed.

Since the capping oxide layer 308 fills the region of the gate 306 which is excessively etched (i.e., the side of the gate which connects to a storage node), a low electric field is applied to the gate oxide layer around the storage node contact region and therefore GIDL occurring in the corresponding region is reduced. In this way, the refresh characteristic of the semiconductor memory device may be improved.

Figure 4A:
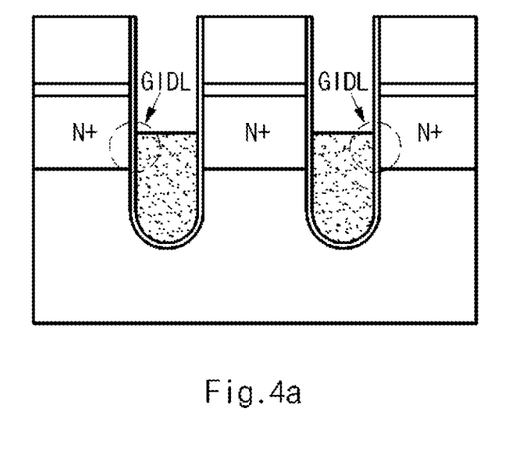
FIGS. 4a to 4c are cross-sectional views showing comparison between the general buried gate structure and the buried gate structure according to the embodiment of the present invention.
Figure 4B:
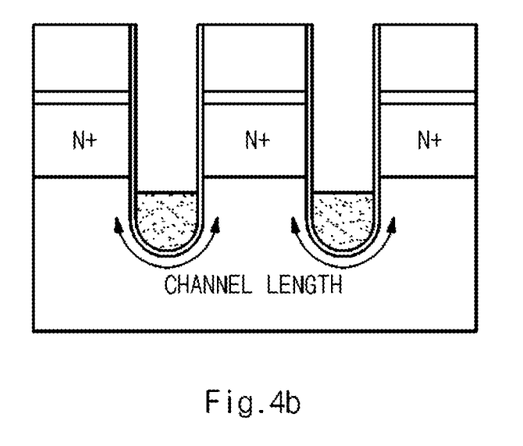
Figure 4C:
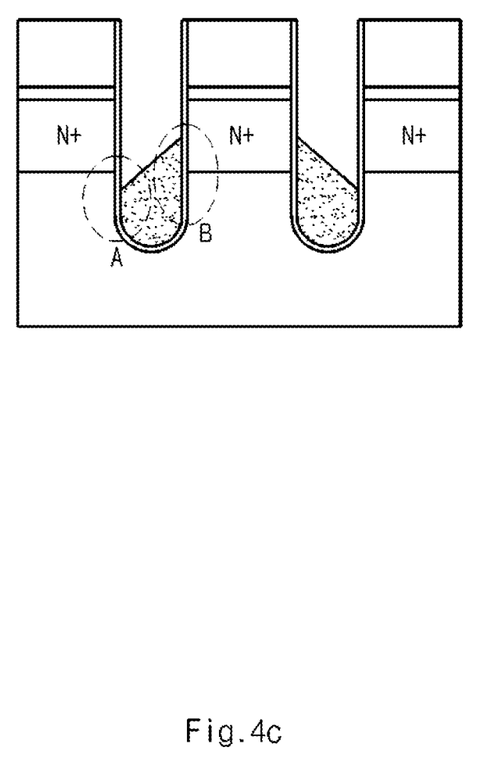

FIGS. 4a to 4c are cross-sectional views showing comparison between the general buried gate structure and the buried gate structure according to the embodiment of the present invention.

Specifically, FIGS. 4a and 4b are cross-sectional views of the general buried gate structure. In the case of FIG. 4a, a gate is formed with a relatively large height inside the recess in order to obtain a sufficient channel length. Therefore, the gate is partially overlapped with the N+ storage node contact region and the N+ bit line contact region disposed on the left and right sides of the gate. At this point, GIDL may be generated by a high electric field in the region overlapped with the storage node contact region. As illustrated in FIG. 4b, if the gate is formed with a relatively small height so that the region overlapped with the storage node contact region is not formed, the generation of the GIDL may be reduced, but the channel length will also be reduced.

Therefore, as illustrated in FIG. 4c, the asymmetric gate structure is formed in order to reduce the generation of the GIDL, while not significantly reducing the channel length. In such an asymmetric gate structure, the gate is formed with a relatively small height in a corresponding region so that the region overlapped with the storage node contact region is not formed (see a portion "A" of FIG. 4c), and with a relatively large height in an opposite region corresponding to the bit line contact region in order to increase the channel region (see a portion "B" of FIG. 4c).

FIGS. 5a to 5e are cross-sectional views illustrating a method for fabricating a semiconductor memory device with a buried gate structure according to another embodiment of the present invention.

Figure 5A:
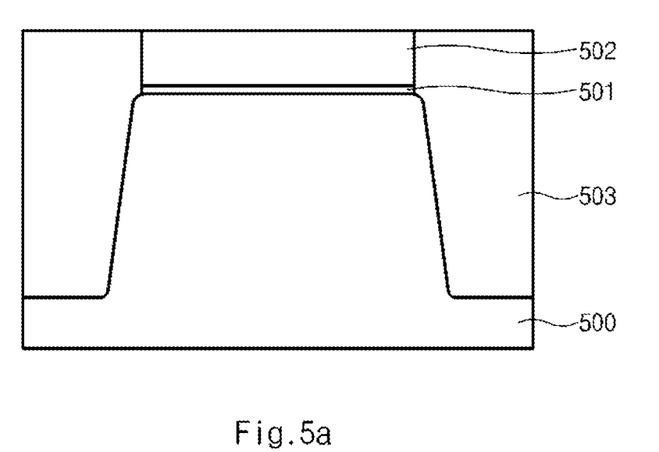
FIGS. 5a to 5f are cross-sectional views illustrating a method for fabricating a semiconductor memory device with a buried gate structure according to another embodiment of the present invention.

Referring to FIG. 5a, a pad oxide layer 501 and a pad nitride layer 502 as insulating layers are sequentially deposited on a semiconductor substrate 500. Using an STI process, an isolation layer 503 is formed to define an active region within the semiconductor substrate 500.

Figure 5B:
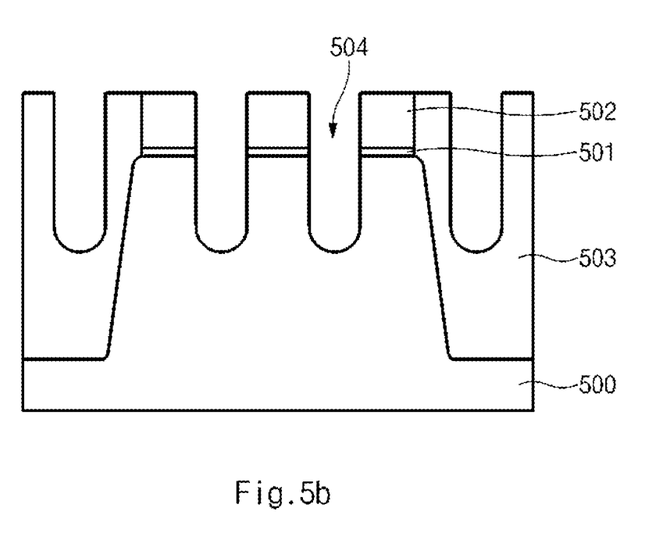

Referring to FIG. 5b, an etch process using a recess gate mask is performed on the active region and the isolation layer 503 to form recesses 504 within the active region and the isolation layer 503. Two recesses 504 are formed in the active region, and one recess 504 is formed within the isolation layer 503.

Figure 5C:
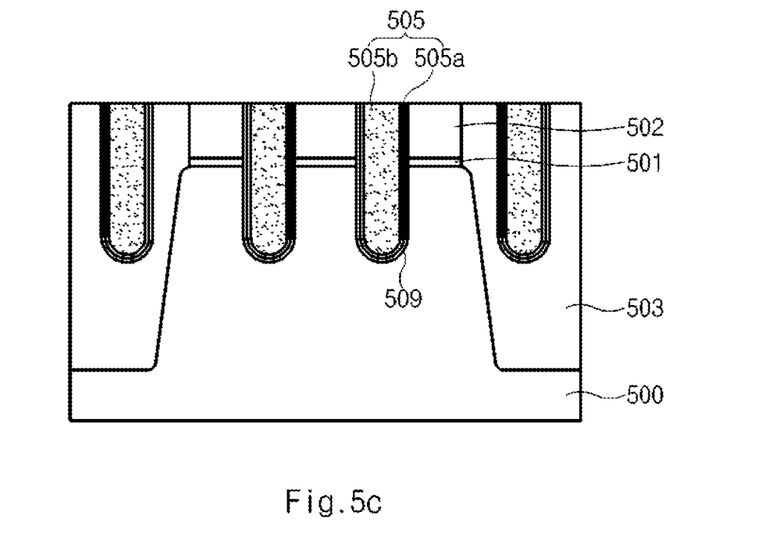

Referring to FIG. 5c, a gate oxidation process is performed on a resulting structure where the recesses 504 are formed, thereby obtaining a gate oxide layer 509 on the surface of each recess 504. A conductive layer 505 including a first metal layer 505a and a second metal layer 505b is deposited with a predetermined thickness to fill the recess 504. At this point, the first metal layer 505a is formed of a material having a good interface characteristic with respect to the gate oxide layer 509, and the second metal layer 505b is formed of a material having a good conductivity. Then, a CMP process is performed to planarize the conductive layer 505 until the upper portion of the pad nitride layer 502 is exposed.

Figure 5D:
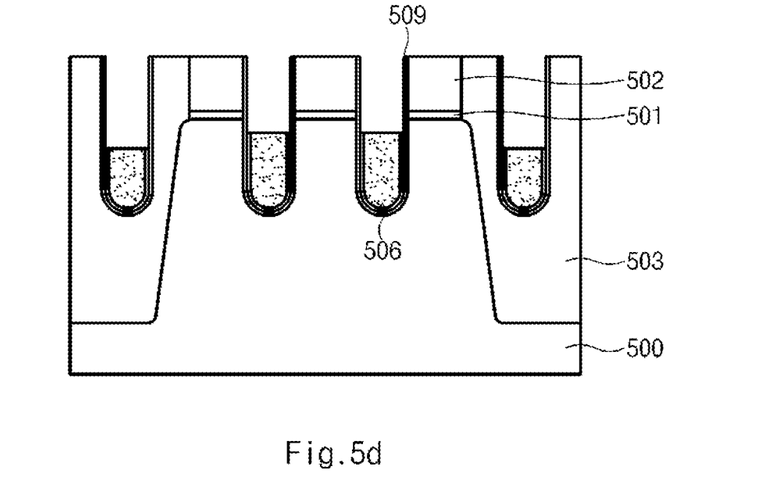

Referring to FIG. 5d, an etch-back process using a difference of etch selectivity between the insulating layers 501 and 502 and the conductive layer 505 is performed to remove a predetermined upper portion of the conductive layer 505 buried within the recess 504, thereby obtaining a gate 506.

Figure 5E:
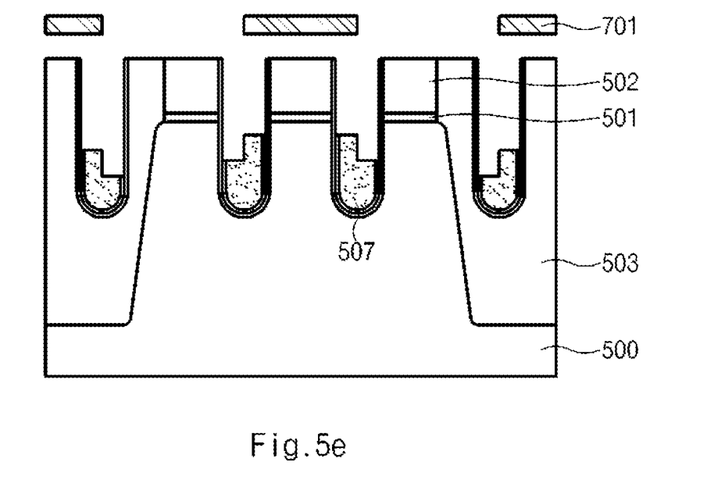

Referring to FIG. 5e, the upper surface of the gate 506 formed within the recess 504 is etched in a step shape using a gate open mask 701, thereby obtaining a stepped gate 507. At this time, in etching the gate 506 using the gate open mask 701, a gate region corresponding to a bit line contact region is blocked by the mask, whereas a gate region corresponding to a storage node contact region is unblocked. Therefore, the gate region corresponding to the storage node contact region unblocked by the mask is etched to form the stepped gate 507.

Figure 5F:
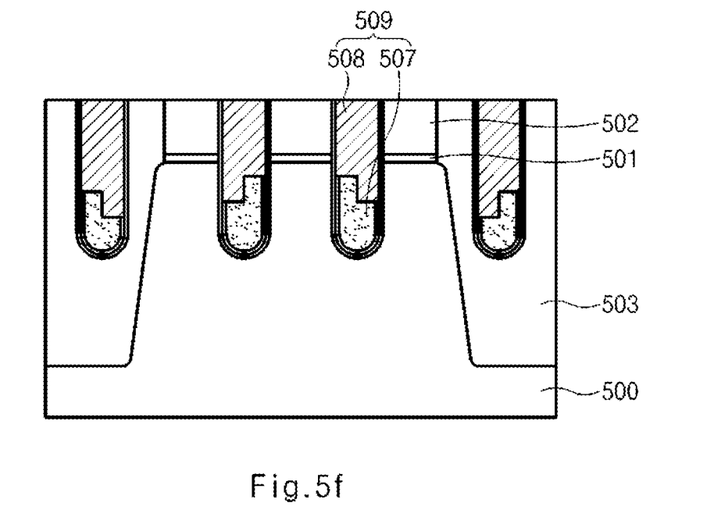

Referring to FIG. 5*f*, a capping oxide layer 508 is deposited on the recess 504, where the stepped gate 507 is formed, and the semiconductor substrate 500, and a planarization process is performed on a resulting structure. In this way, an asymmetric stepped buried gate structure 509 including the stepped gate 507 and the capping oxide layer 508 is completed. In forming the stepped gate 507, since the capping oxide layer 508 is formed to fill the region where the lower step of the gate is removed (i.e., the side connecting to the storage node), an electric field applied to an interfacial oxide layer between the buried gate structure and the storage node contact region is weakened, thereby reducing the generation of the GIDL.

As described above, in the asymmetric buried gate structure, the tapered etch process or the stepped etch process using the mask is performed on the metal layer for the gate, so that the channel around the storage node contact region is formed smaller than the channel around the bit line contact region. In this way, the channel length is not significantly reduced. Since the channel length is ensured, the channel dose may be reduced and the refresh characteristics improved.

Moreover, since the buried gate structure is formed by forming the capping oxide layer to fill a place where the metal layer around the relatively excessively etched storage node contact region is formed, a low electric field is applied to the gate oxide layer. Consequently, the generation of GIDL is reduced, thereby improving the refresh characteristics of the semiconductor memory device.

The above embodiments of the present invention are illustrative and not imitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for fabricating a semiconductor memory device, the method comprising:
    forming an isolation structure over a substrate, the isolation structure defining an active region;
    forming a recess within the active region;
    filling the recess with conductive material;
    etching the conductive material within the recess to form a gate having a height difference between a first side proximate a bit line contact region and a second side proximate a storage node contact region, the etched conductive material exposing an upper portion of the recess; and
    filling the upper portion of the recess with a capping oxide layer,
    wherein the etching the conductive material includes asymmetrically etching the conductive material in the recess using a tapered etch process to provide a top surface of the gate with a slope.

2. The method according to claim 1, wherein the filling the recess with the conductive material includes:
    oxidizing the recess to form a gate oxide layer along an inner wall of the recess;
    depositing a first metal layer conformally over the inner wall of the recess;
    depositing a second metal layer serving as the conductive material to fill the recess; and
    planarizing the first metal layer and the second metal layer.

3. The method according to claim 2, wherein the first metal layer has a better interfacial property than the second metal layer with respect to the gate oxide layer, and the second metal layer has a better conductivity property than the first metal layer.

4. The method according to claim 1, wherein, in etching the conductive material within the recess, the conductive material is asymmetrically etched so that the height difference is in a range of approximately 100 Å to approximately 500 Å.

5. The method according to claim 1, wherein the first side proximate the bit line contact region is disposed at a higher level than the second side proximate the storage node contact region.

6. The method according to claim 1, wherein the tapered etch process uses a photoresist flow to form a photoresist pattern having a tapered profile.

7. The method according to claim 6, wherein the tapered etch process using the photoresist pattern having the tapered profile includes a baking process using a hot plate.

8. The method according to claim 1, wherein the height difference between the first side and the second side is at least 100 Å.

9. The method according to claim 1, wherein the forming of the capping oxide layer is performed so that an oxidation does not occur when the capping oxide layer contacts the conductive material.

10. The method according to claim 1, the method further comprising implanting ions into the storage node contact region and the bit line contact region to form an N-type storage node contact region and an N-type bit line contact region, respectively.

11. A semiconductor memory device, comprising:
    an isolation structure defining an active region of a substrate;
    a recess formed in the active region;
    a gate having a height difference formed in the recess; and
    a capping oxide layer in the recess and over the gate,
    wherein an upper surface of the gate has a gradually sloping profile, and
    wherein the gate includes a first side proximate a bit line contact region and a second side proximate a storage node contact region, the first side being at a higher level than the second side.

12. The semiconductor memory device according to claim 11, wherein the gate includes:
    a first metal layer formed conformally along an inner wall of the recess;
    a second metal layer formed over the first metal; and
    an oxide layer formed between the inner wall of the recess and the first metal layer.

13. The semiconductor memory device according to claim 11, wherein the height difference is at least 50 Å and no more than 500 Å.

14. The semiconductor memory device according to claim 11, wherein the gradually sloping profile of the gate is formed using a tapered etch process.

* * * * *